United States Patent
Ito et al.

(10) Patent No.: US 7,362,205 B2
(45) Date of Patent: Apr. 22, 2008

(54) COMMON-MODE FILTER

(75) Inventors: Tomokazu Ito, Tokyo (JP); Takeshi Okumura, Tokyo (JP)

(73) Assignee: TDK Corporation, Tokyo (JP)

( * ) Notice: Subject to any disclaimer, the term of this patent is extended or adjusted under 35 U.S.C. 154(b) by 104 days.

(21) Appl. No.: 11/502,373

(22) Filed: Aug. 11, 2006

(65) Prior Publication Data

US 2007/0285202 A1  Dec. 13, 2007

(30) Foreign Application Priority Data

Aug. 26, 2005  (JP) ............................ P2005-246532
Jul. 14, 2006  (JP) ............................ P2006-194479

(51) Int. Cl.
*H01F 5/00* (2006.01)

(52) U.S. Cl. .................. 336/200; 336/232; 336/223

(58) Field of Classification Search .............. 336/200, 336/223, 232
See application file for complete search history.

(56) References Cited

U.S. PATENT DOCUMENTS

| | | | |
|---|---|---|---|
| 6,710,694 B2 * | 3/2004 | Matsuta et al. ............. | 336/200 |
| 7,064,629 B2 * | 6/2006 | Shoji .......................... | 333/185 |
| 7,119,649 B2 * | 10/2006 | Shinkai et al. ............... | 336/200 |
| 7,283,028 B2 * | 10/2007 | Yoshida et al. .............. | 336/200 |
| 2003/0137384 A1 * | 7/2003 | Itou et al. .................... | 336/200 |

FOREIGN PATENT DOCUMENTS

| | | |
|---|---|---|
| JP | A 8-203737 | 8/1996 |
| JP | A 2001-60514 | 3/2001 |
| JP | A 2004-339016 | 12/2004 |
| JP | A 2005-50956 | 2/2005 |
| JP | A 2005-50957 | 2/2005 |

* cited by examiner

*Primary Examiner*—Anh Mai
(74) *Attorney, Agent, or Firm*—Oliff & Berridge, PLC

(57) ABSTRACT

A common-mode filter comprises a first conductor layer, a second conductor layer, and an insulating layer placed between the first and second conductor layers. The first conductor layer has a first spiral part formed such as to draw a convolution and a first lead electrode extending from one end of the first spiral part. The second conductor layer has a second spiral part formed such as to draw a convolution and a second lead electrode extending from one end of the second spiral part. The first conductor layer is formed with third and fourth lead electrodes. The second conductor layer is formed with a connecting conductor connecting the third lead electrode to the other end of the first spiral part. The fourth lead electrode is connected to the other end of the second spiral part through a contact hole formed in the insulating layer. The third lead electrode is connected to one end of the connecting conductor through a contact hole formed in the insulating layer. The other end of the connecting conductor is connected to the other end of the first spiral part through a contact hole formed in the insulating layer.

6 Claims, 9 Drawing Sheets

COMMON-MODE FILTER

BACKGROUND OF THE INVENTION

1. Field of the Invention

The present invention relates to a common-mode filter.

2. Related Background Art

As electronic devices such as personal computers and cellular phones have been becoming smaller, electronic components such as coils and capacitors mounted in inner circuits of the electronic devices have been demanded to be made smaller and thinner. Known as one of thin-film coil components responding to such a demand is a common-mode filter (see, for example, Japanese Patent Application Laid-Open No. 2005-50957).

SUMMARY OF THE INVENTION

The common-mode filter disclosed in Japanese Patent Application Laid-Open No. 2005-50957 (the multilayer common-mode choke coil in the publication) arranges two coils over two layers such that the two coils are wound in the same direction while individual portions of each coil are adjacent to each other on the same layer.

Therefore, the input and output portions of the respective coils are located close to each other through a layer, thereby increasing stray capacitance. As a result, the resonance frequency decreases, thereby lowering the common-mode characteristic in a high-frequency band. Further, since the individual portions of the coil are adjacent to each other on the same layer, the electric strength between coil lines may decrease.

For solving this technical problem, on the other hand, a common-mode filter has been proposed, in which input and output portions of coils are formed in respective layers different from each other, while convoluted portions are formed in two layers, so that the conductor portions alone are constructed by four layers in total. However, manufacturing such a multilayer common-mode filter increases processes, thereby complicating the manufacturing step, which becomes another problem to overcome.

Therefore, it is an object of the present invention to provide a common-mode filter which can simplify the manufacturing step without causing problems such as those of stray capacitance and electric strength between lines.

The common-mode filter in accordance with the present invention comprises a first conductor layer having a first spiral part formed so as to draw a convolution and a first lead electrode extending from one end of the first spiral part; a second conductor layer having a second spiral part formed so as to draw a convolution and a second lead electrode extending from one end of the second spiral part; and an insulating layer placed between the first and second conductor layers; wherein the first conductor layer is formed with third and fourth lead electrodes; wherein the second conductor layer is formed with a connecting conductor connecting the third lead electrode to the other end of the first spiral part; wherein the fourth lead electrode is connected to the other end of the second spiral part through a contact hole formed in the insulating layer; wherein the third lead electrode is connected to one end of the connecting conductor through a contact hole formed in the insulating layer; and wherein the other end of the connecting conductor is connected to the other end of the first spiral part through a contact hole formed in the insulating layer.

The present invention can form a common-mode filter having a three-layer structure of the first conductor layer, the second conductor layer, and the insulating layer placed therebetween as a basic structure, and thus can simplify its manufacturing step.

Since the third lead electrode is connected to the other end of the first spiral part through the connecting conductor, a distance is secured between the third lead electrode and the first lead electrode connected to one end of the first spiral part. This can restrain the problem of stray capacitance from occurring.

Since the first conductor layer is formed with the fourth lead electrode connected to the other end of the second spiral part, a distance is secured between the fourth lead electrode and the second lead electrode formed on the second conductor layer. This can restrain the problem of stray capacitance from occurring.

Since the first and second conductor layers are formed with the first and second spiral parts, respectively, an interline distance can be secured between the first and second spiral parts. This can restrain the problem of electric strength between lines from occurring.

Preferably, the first and second conductor layers have respective regions overlapping each other. Since the first and second conductor layers overlap each other, the common-mode characteristic can be improved in this case.

More preferably, the first spiral part has a first bent portion bent toward a center of the first spiral part, the second spiral part has a second bent portion bent toward a side opposite from a center of the second spiral part at a position corresponding to the first bent portion, and a region other than the first bent portion in the first spiral part and a region other than the second bent portion in the second spiral part overlap each other. This increases a region in which the first and second conductor layers overlap each other, thereby enhancing magnetic coupling. Consequently, the common-mode characteristic can further be improved.

More preferably, a conductor forming the first spiral part and a conductor forming the second spiral part have substantially the same length. In this case, the first and second spiral parts have substantially the same inductance, whereby the difference between the inductances of the first and second conductor layers can be made smaller. This can further improve the common-mode characteristic.

Preferably, the first and second conductor layers are formed with a plurality of first spiral parts, first lead electrodes, second spiral parts, second lead electrodes, third lead electrodes, fourth lead electrodes, and connecting conductors corresponding thereto. This can provide a so-called array type common-mode filter, since the first and second conductor layers are formed with a plurality of first spiral parts, first lead electrodes, second spiral parts, second lead electrodes, third lead electrodes, fourth lead electrodes, and connecting conductors corresponding thereto.

Preferably, the common-mode filter further comprises a third conductor layer having a third spiral part formed so as to draw a convolution and a fifth lead electrode extending from one end of the third spiral part; a fourth conductor layer having a fourth spiral part formed so as to draw a convolution and a sixth lead electrode extending from one end of the fourth spiral part; an insulating layer placed between the second and third conductor layers; and an insulating layer placed between the third and fourth conductor layers; wherein the fourth conductor layer is formed with seventh and eighth lead electrodes; wherein the fourth conductor layer is formed with a second connecting conductor connecting the seventh lead electrode to the other end of the third spiral part; wherein the eighth lead electrode is connected to the other end of the fourth spiral part through a contact hole formed in the insulating layer placed between the third and fourth conductor layers; wherein the seventh lead electrode is connected to one end of the second connecting conductor through a contact hole formed in the insulating layer placed between the third and fourth conductor layers; and wherein the other end of the second connecting conductor is connected to the other end of the third spiral part through a contact hole formed in the insulating layer placed between the third and fourth conductor layers. In this case, the third and fourth spiral parts are provided in addition to the first and second spiral parts, whereby a 4-line common-mode filter can be provided.

The present invention can provide a common-mode filter which can simplify its manufacturing step without causing problems such as those of stray capacitance and electric strength between lines.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The findings of the present invention can easily be understood in view of the following detailed descriptions with reference to the accompanying drawings represented for illustration only. Embodiments of the present invention will now be explained with reference to the accompanying drawings. When possible, the same parts will be referred to with the same numerals without repeating their overlapping descriptions.

First Embodiment

Figure 1:
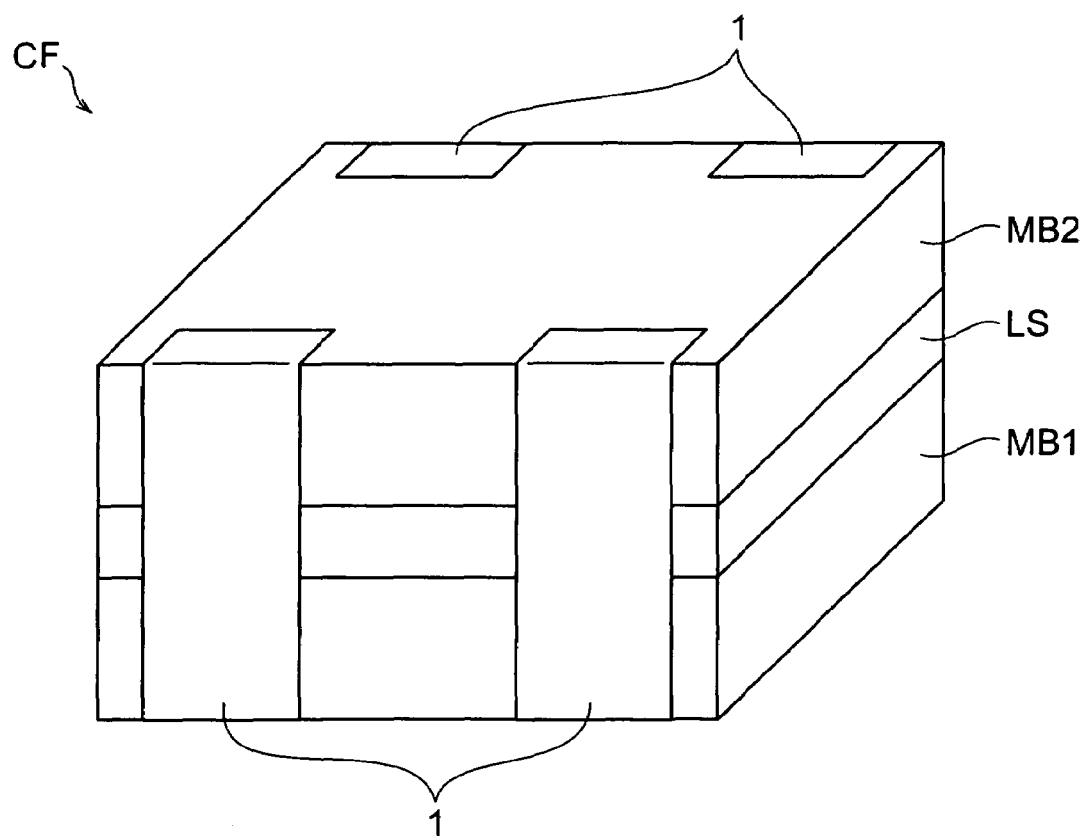
FIG. 1 is a perspective view showing a common-mode filter which is a first embodiment.

A common-mode filter which is a first embodiment will be explained with reference to FIG. 1. FIG. 1 is a perspective view showing a common-mode filter CF.

As shown in FIG. 1, the common-mode filter CF is a common-mode filter of a thin film type comprising a first magnetic substrate MB1, a layer structure LS, and a second magnetic substrate MB2. Terminal electrodes 1 are formed on the outer peripheral face of the multilayer body constructed by the first magnetic substrate MB1, layer structure LS, and second magnetic substrate MB2. The terminal electrodes 1 are formed such as to extend from the first magnetic substrate MB1 to the second magnetic substrate MB2 by way of the layer structure LS. The terminal electrodes 1 are formed by two pairs on two opposing side faces of the above-mentioned multilayer body.

Figure 2:
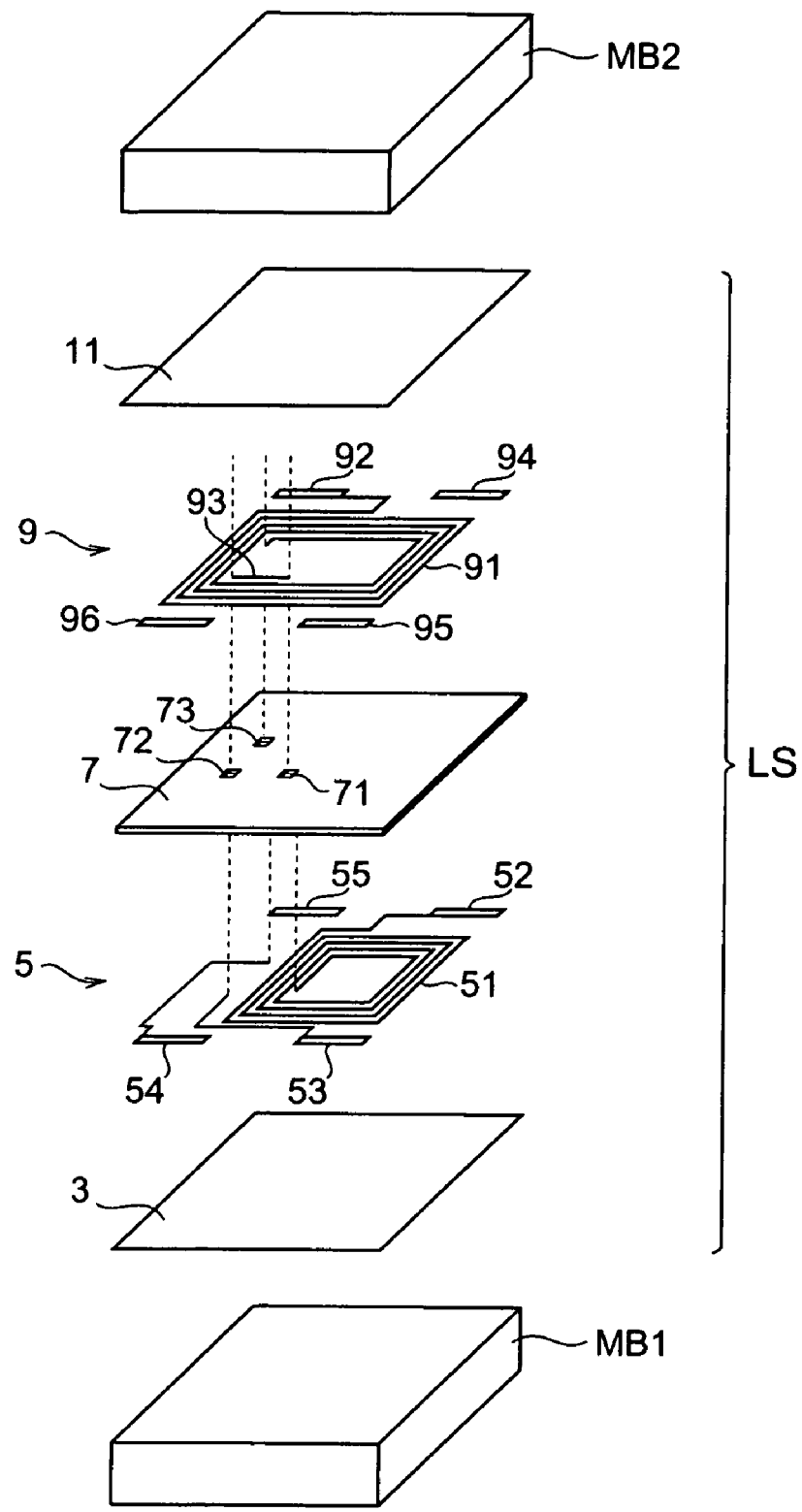
FIG. 2 is an exploded perspective view of a layer structure in FIG. 2.

FIG. 2 is a schematic view showing the common-mode filter CF in an exploded fashion. The layer structure LS will be explained with reference to FIG. 2. As shown in FIG. 2, the layer structure LS is formed by laminating a first insulating layer 3, a first conductor layer 5, a second insulating layer 7, a second conductor layer 9, and a third insulating layer 11 by a thin-film forming technique.

The first insulating layer 3 is made of a resin material which is excellent in electric and magnetic insulating properties while having favorable workability, such as polyimide and epoxy resins. The first insulating layer 3 aims at alleviating irregularities of the first magnetic substrate MB1 and improving the adhesion to the first conductor layer. The first insulating layer 3 is formed by applying the above-mentioned resin material onto the first magnetic substrate MB1 and then curing it. The resin material can be applied by a technique such as spin coating, dipping, or spraying.

The first conductor layer 5 is formed on the first insulating layer 3. The first conductor layer 5 has a spiral part 51 (first spiral part), a lead electrode 52 (first lead electrode), a lead electrode 53 (third lead electrode), a lead electrode 54 (fourth lead electrode), and a lead electrode 55. The first conductor layer 5 is produced by forming a thin conductor film on the first insulating layer 3 and then making a pattern of the spiral part 51 and lead electrodes 52, 53, 54, 55 by photolithography.

The spiral part 51 is formed so as to form a rectangular convolution in a plane along which the first insulating layer 3 extends. A lead electrode 52 extends from an outer end of the spiral part 51. The lead electrode 52 is formed so as to reach one side of the first insulating layer 3 from the outer end (one end) of the spiral part 51.

The lead electrode 53 is formed so as to extend along the outer periphery of the spiral part 51 from one side of the first insulating layer 3 opposing the side thereof where the lead electrode 52 reaches. On the outside of the spiral part 51, one end of the lead electrode 53 is placed at a position corresponding to the inner end (other end) of the spiral part 51.

The lead electrode 54 is formed so as to extend along the outer periphery of the first insulating layer 3 from the side of the first insulating layer 3 opposing the side thereof where the lead electrode 52 reaches. One end of the lead electrode 54 is placed at a position corresponding to the inner end (other end) of a spiral part 91 which will be explained later. The lead electrode 55 is formed at the side of the first insulating layer 3 where the lead electrode 52 reaches.

The second insulating layer 7 is formed on the first conductor layer 5. The second insulating layer 7 is made of a resin material which is excellent in electric and magnetic insulating properties while having favorable workability, such as polyimide and epoxy resins. The second insulating layer 7 is formed with contact holes 71, 72, 73.

The contact hole 71 is formed at a position where the inner end (other end) of the spiral part 51 can be seen therethrough. The contact hole 72 is formed at a position where one end of the lead electrode 53 can be seen therethrough. The contact hole 73 is formed at a position where one end of the lead electrode 54 can be seen therethrough.

The second insulating layer 7 is formed by applying the above-mentioned resin material onto the first conductor layer 5, exposing the applied resin material to light, and developing it, so as to cure it while in a state where the contact holes 71, 72, 73 are formed at predetermined positions. The resin material can be applied by a technique such as spin coating, dipping, or spraying.

The second conductor layer 9 is formed on the second insulating layer 7. The second conductor layer 9 has the spiral part 91 (second spiral part), a lead electrode 92 (second lead electrode), a connecting conductor 93, a lead electrode 94, a lead electrode 95, and a lead electrode 96. The second conductor layer 9 is produced by forming a thin conductor film on the second insulating layer 7 and then making a pattern of the spiral part 91, lead electrodes 92, 94, 95, 96, and connecting conductor 93 by photolithography.

The spiral part 91 is formed so as to draw a rectangular convolution in a plane along which the second insulating layer 7 extends. The lead electrode 92 extends from the outer end (one end) of the spiral part 91. The lead electrode 92 is formed so as to reach one side of the second insulating layer 7 from the outer end (one end) of the spiral part 91. The inner end (other end) of the spiral part 91 is formed at a position corresponding to the contact hole 73 in the second insulating layer 7. Therefore, when the spiral part 91 is formed, the contact hole 73 is filled with a conductor, which comes into contact with the lead electrode 54 of the first conductor layer 5, so as to be electrically connected thereto.

On the inside of the spiral part 91, the connecting conductor 93 is formed from a position corresponding to the contact hole 71 in the second insulating layer 7 to a position corresponding to the contact hole 72. Therefore, when the connecting conductor 93 is formed, the contact holes 71 and 72 are filled with a conductor, whereby the inner end (other end) of the spiral part 51 of the first conductor layer 5 and the lead electrode 53 come into contact with the connecting conductor 93, so as to be electrically connected thereto.

The lead electrode 94 is formed along the side of the second insulating layer 7 where the lead electrode 92 reaches. The lead electrodes 95 and 96 are formed along one side of the second insulating layer 7 opposing the side thereof where the lead electrode 92 reaches.

The third insulating layer 11 is formed on the second conductor layer 9. The third insulating layer 11 is made of a resin material which is excellent in electric and magnetic insulating properties while having favorable workability, such as polyimide and epoxy resins. The third insulating layer 11 is formed by applying the above-mentioned resin material onto the second conductor layer 9 and then curing it. The resin material can be applied by a technique such as spin coating, dipping, or spraying.

The second magnetic substrate MB2 is bonded onto the third insulating layer 11 through an adhesive layer (not depicted).

Figure 3:
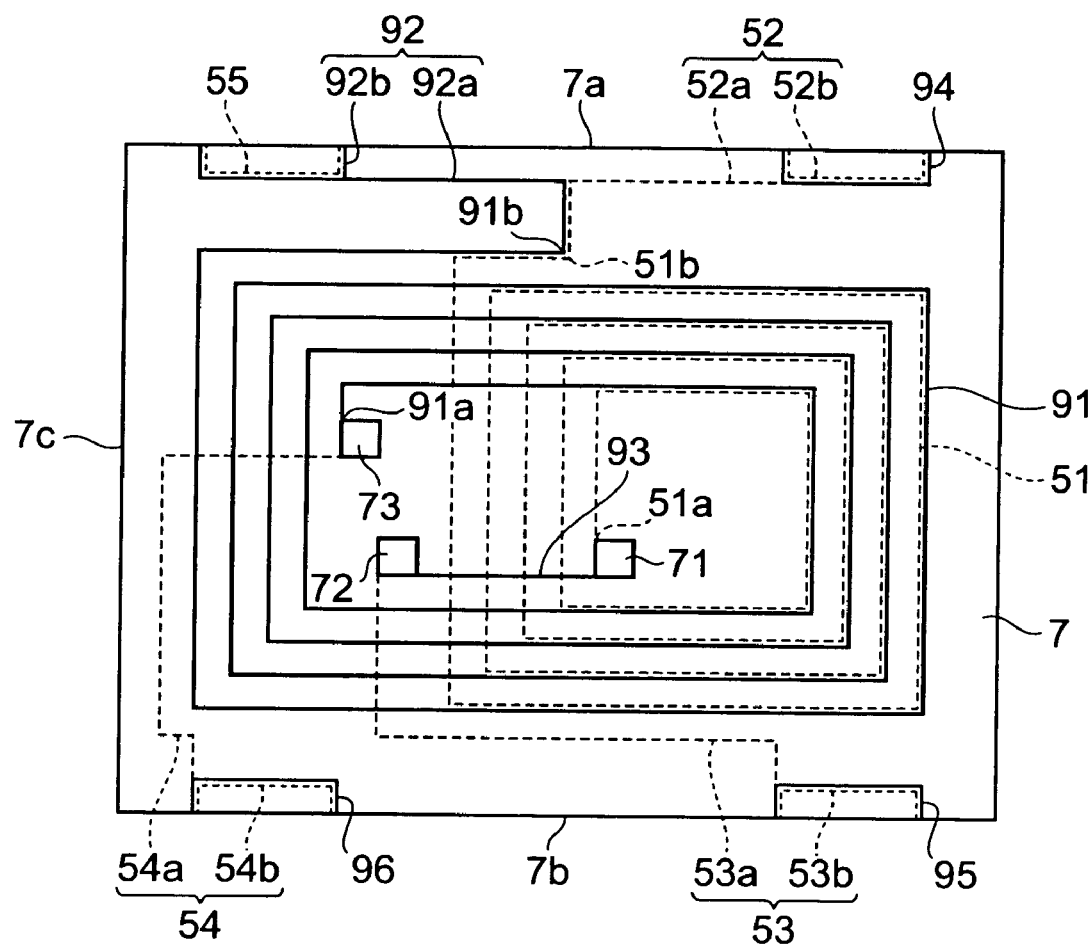
FIG. 3 is a plan view of the layer structure shown in FIG. 1.

The first conductor layer 5 and second conductor layer 9 will now be explained with reference to FIG. 3. FIG. 3 is a plan view of the layer structure LS, illustrating a state removing the third insulating layer 11. In FIG. 3, solid and broken lines indicate the second conductor layer 9 and first conductor layer 5, respectively, whereas the portion drawn by a double line composed of solid and broken lines shows a portion where patterns of the first conductor layer 5 and second conductor layer 9 overlap each other.

The spiral part 51 of the first conductor layer 5 employs an end portion 51a formed at a position in contact with the contact hole 71 as the inner end (other end), and is formed so as to draw a rectangular convolution outward therefrom to an end portion 51b acting as the outer end (one end).

The lead electrode 52 is constructed by a linear portion 52a and a planar portion 52b. The linear portion 52a is connected to the end portion 51b that is the outer end (one end) of the spiral part 51. The planar portion 52b is connected to the linear portion 52a.

The linear portion 52a extends from the end portion 51b of the spiral part 51 toward a side 7a of the second insulating layer 7, and is bent along the side 7a, so as to reach the planar portion 52b.

The lead electrode 53 is positioned so as to oppose the lead electrode 52. The lead electrode 53 is constructed by a planar portion 53b and a linear portion 53a. The planar portion 53b is formed along a side 7b of the second insulating layer 7. The linear portion 53a extends so as to connect the planar portion 53b and the contact hole 72 to each other.

The linear portion 53a extends from the planar portion 53b toward the spiral part 51, and then circumvents the spiral part 51, so as to reach the contact hole 72.

The contact holes 71 and 72 are connected to both ends of the connecting conductor 93, respectively. The connecting conductor 93 is formed so as to bridge the inside and outside of the spiral part 51. Since the contact hole 72 is formed at a position separated from the outermost peripheral portion of the spiral part 51, stray capacitance can be prevented from occurring between the lead electrodes 52 and 53 (the input and output portions of the spiral part 51).

The spiral part 91 of the second conductor layer 9 employs an end portion 91a formed at a position in contact with the contact hole 73 as the inner end (other end), and is formed so as to draw a rectangular convolution outward therefrom to an end portion 91b acting as the outer end (one end).

The lead electrode 92 is constructed by a linear portion 92a and a planar portion 92b. The linear portion 92a is connected to the end portion 91b that is the outer end (one end) of the spiral part 91. The planar portion 92b is connected to the linear portion 92a.

The linear portion 92a extends from the end portion 91b of the spiral part 91 toward the side 7a of the second insulating layer 7, and is bent along the side 7a, so as to reach the planar portion 92b.

The lead electrode 54 is positioned so as to oppose the lead electrode 92 (lead electrode 55). The lead electrode 54 is constructed by a planar portion 54b and a linear portion 54a. The planar portion 54b is formed along the side 7b of the second insulating layer 7. The linear portion 54a extends so as to connect the planar portion 54b and the contact hole 73 to each other.

The linear portion 54a extends from the planar portion 54b toward the spiral part 91, and then along a side 7c of the second insulating layer 7 such as to circumvent the spiral part 91. The linear portion 54a is bent at substantially the middle position of the side 7c, so as to reach the contact hole 73.

The contact hole 73 is connected to the inner end (other end) of the spiral part 91 and the linear portion 54a.

Therefore, the spiral part 91 and lead electrode 54 are in contact with each other so as to be electrically connected together.

Since the linear portion 54a of the lead electrode 54 is formed at a position separated from the outermost peripheral portion of the spiral part 91, stray capacitance can be prevented from occurring between the lead electrodes 92 and 54 (the input and output portions of the spiral part 91).

When two spiral parts 51 and 91 are formed so as to interpose the second insulating layer 7 therebetween as in this embodiment, interline electric strength can be secured more than in the case where two spiral parts are formed such that their respective wound portions are adjacent to each other.

Since the two spiral parts 51 and 91 are arranged such as to have respective regions overlapping each other as seen in the laminating direction, this embodiment is excellent in the common-mode characteristic. The common-mode characteristic can further be improved when the two spiral parts 51 and 91 are arranged such as to overlap each other by one half or more as seen in the laminating direction.

Second Embodiment

Figure 4:
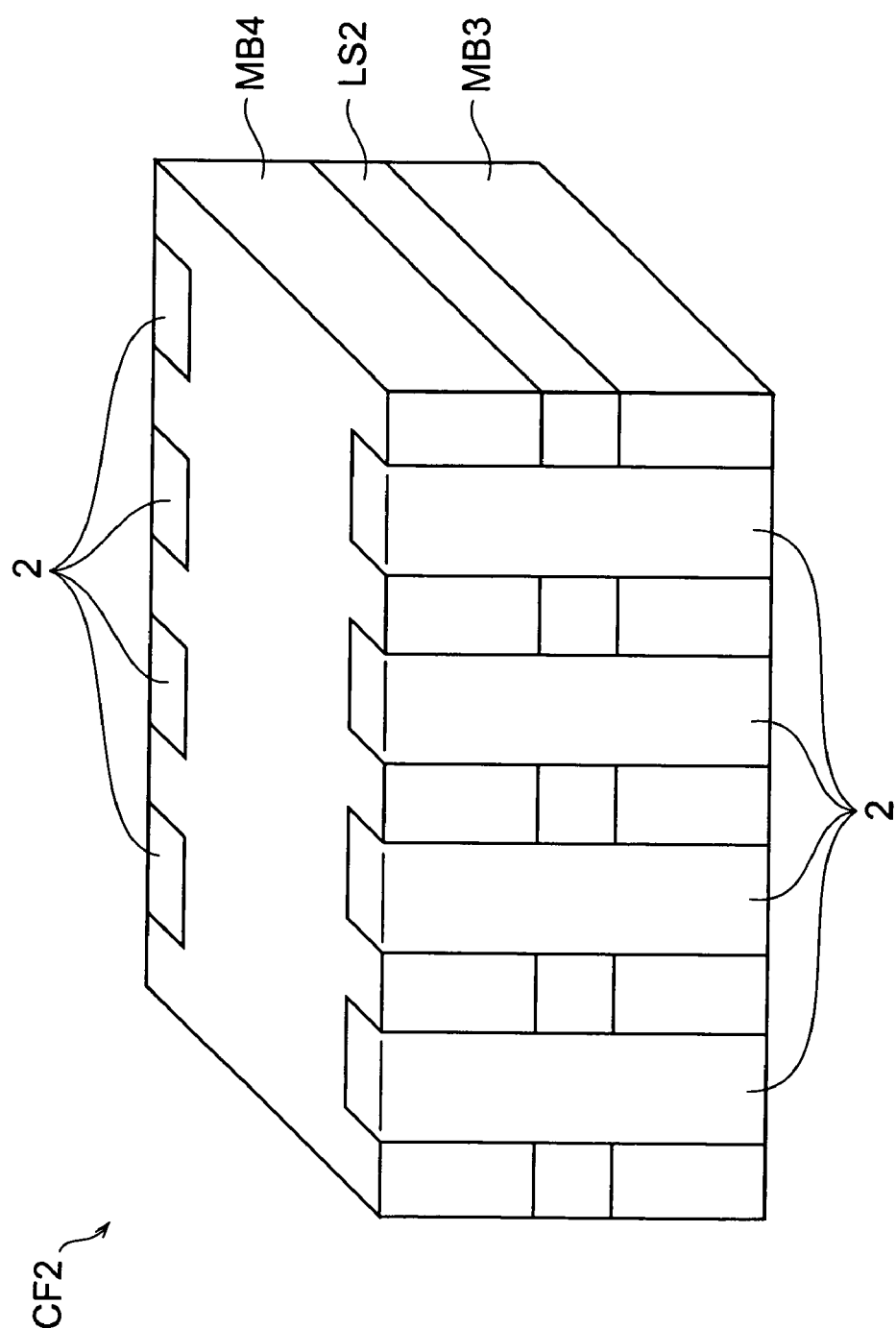
FIG. 4 is a perspective view showing a common-mode filter which is a second embodiment.

A common-mode filter which is a second embodiment of the present invention will be explained with reference to FIG. 4. FIG. 4 is a perspective view showing a common-mode filter CF2.

As shown in FIG. 4, the common-mode filter CF2 is a common-mode filter of a thin film type comprising a first magnetic substrate MB3, a layer structure LS2, and a second magnetic substrate MB4. Terminal electrodes 2 are formed on the outer peripheral face of the multilayer body constructed by the first magnetic substrate MB3, layer structure LS2, and second magnetic substrate M4. The terminal electrodes 2 are formed such as to extend from the first magnetic substrate MB3 to the second magnetic substrate MB4 by way of the layer structure LS2. The terminal electrodes 2 are formed by four pairs on two opposing side faces of the above-mentioned multilayer body.

Figure 5:
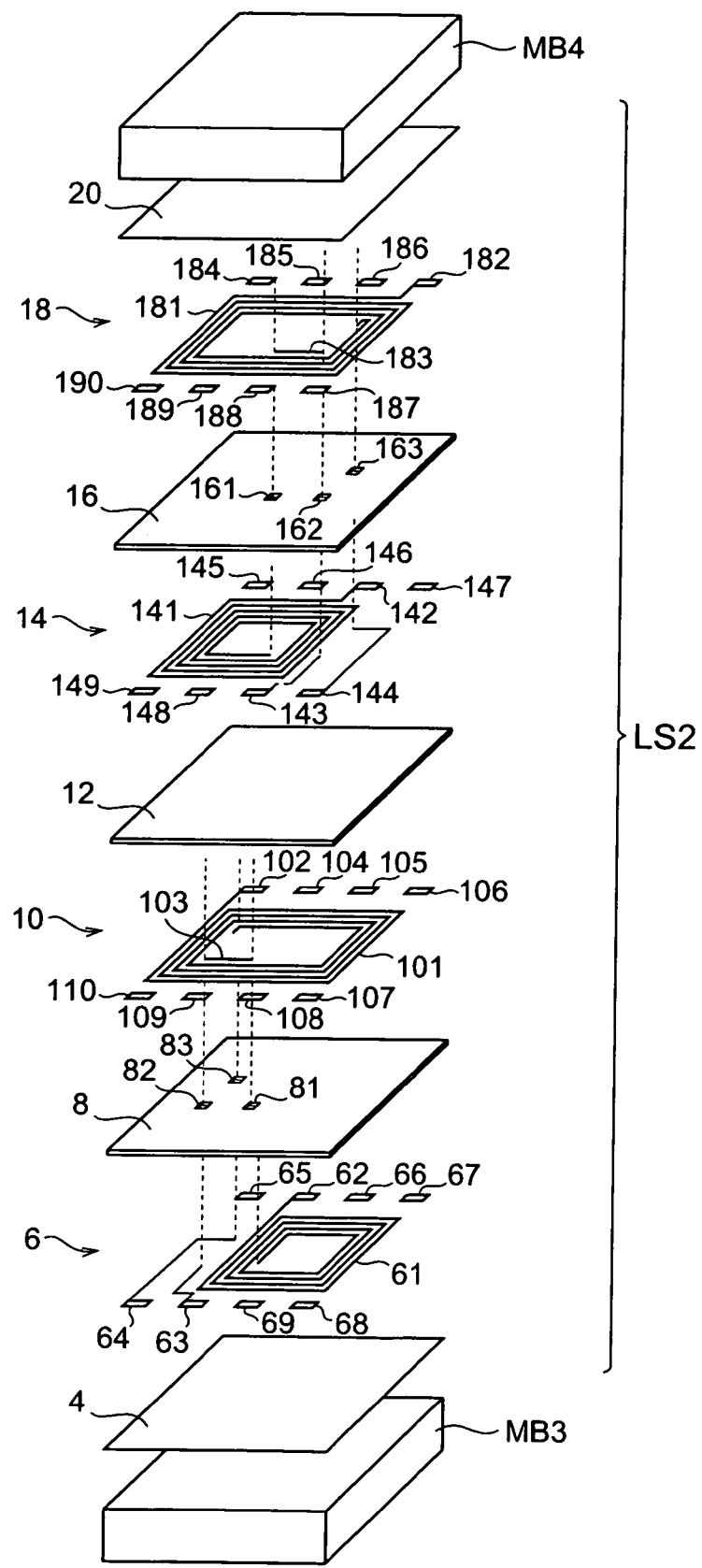
FIG. 5 is an exploded perspective view of a layer structure shown in FIG. 4.

FIG. 5 is a schematic view showing the common-mode filter CF2 in an exploded fashion. The layer structure LS2 will be explained with reference to FIG. 5. As shown in FIG. 5, the layer structure LS2 is formed by laminating a first insulating layer 4, a first conductor layer 6, a second insulating layer 8, a second conductor layer 10, a third insulating layer 12, a third conductor layer 14, a fourth insulating layer 16, a fourth conductor layer 18, and a fifth insulating layer 20 by a thin-film forming technique.

The first insulating layer 4 is made of a resin material which is excellent in electric and magnetic insulating properties while having favorable workability, such as polyimide and epoxy resins. The first insulating layer 4 aims at alleviating irregularities of the first magnetic substrate MB3 and improving the adhesion to the first conductor layer 6. The first insulating layer 4 is formed by applying the above-mentioned resin material onto the first magnetic substrate MB3 and then curing it. The resin material can be applied by a technique such as spin coating, dipping, or spraying.

The first conductor layer 6 is formed on the first insulating layer 4. The first conductor layer 6 has a spiral part 61 (first spiral part), a lead electrode 62 (first lead electrode), a lead electrode 63 (third lead electrode), a lead electrode 64 (fourth lead electrode), and lead electrodes 65, 66, 67, 68, 69. The first conductor layer 6 is produced by forming a thin conductor film on the first insulating layer 4 and then making a pattern of the spiral part 61 and lead electrodes 62, 63, 64, 65, 66, 67, 68, 69 by photolithography.

The spiral part 61 is formed so as to form a rectangular convolution in a plane along which the first insulating layer 4 extends. A lead electrode 62 extends from an outer end of the spiral part 61. The lead electrode 62 is formed so as to reach one side of the first insulating layer 4 from the outer end (one end) of the spiral part 61.

The lead electrode 63 is formed so as to extend along the outer periphery of the spiral part 61 from one side of the first insulating layer 4 opposing the side thereof where the lead electrode 62 reaches. On the outside of the spiral part 61, one end of the lead electrode 63 is placed at a position corresponding to the inner end (other end) of the spiral part 61.

The lead electrode 64 is formed so as to extend along the outer periphery of the first insulating layer 4 from the side of the first insulating layer 4 opposing the side thereof where the lead electrode 62 reaches. One end of the lead electrode 64 is placed at a position corresponding to the inner end (other end) of a spiral part 101 which will be explained later. The lead electrodes 65, 66, 67 are formed at the side of the first insulating layer 4 where the lead electrode 62 reaches. The lead electrodes 68, 69 are formed at the side of the first insulating layer 4 opposing the side thereof where the lead electrode 62 reaches.

The second insulating layer 8 is formed on the first conductor layer 6. The second insulating layer 8 is made of a resin material which is excellent in electric and magnetic insulating properties while having favorable workability, such as polyimide and epoxy resins. The second insulating layer 8 is formed with contact holes 81, 82, 83.

The contact hole 81 is formed at a position where the inner end (other end) of the spiral part 61 can be seen therethrough. The contact hole 82 is formed at a position where one end of the lead electrode 63 can be seen therethrough. The contact hole 83 is formed at a position where one end of the lead electrode 64 can be seen therethrough.

The second insulating layer 8 is formed by applying the above-mentioned resin material onto the first conductor layer 6, exposing the applied resin material to light, and developing it, so as to cure it while in a state where the contact holes 81, 82, 83 are formed at predetermined positions. The resin material can be applied by a technique such as spin coating, dipping, or spraying.

The second conductor layer 10 is formed on the second insulating layer 8. The second conductor layer 10 has the spiral part 101 (second spiral part), a lead electrode 102 (second lead electrode), a connecting conductor 103, and lead electrodes 104, 105, 106, 107, 108, 109, 110. The second conductor layer 10 is produced by forming a thin conductor film on the second insulating layer 8 and then making a pattern of the spiral part 101, lead electrodes 102, 104, 105, 107, 108, 109, 110, and connecting conductor 103 by photolithography.

The spiral part 101 is formed so as to draw a rectangular convolution in a plane along which the second insulating layer 8 extends. The lead electrode 102 extends from the outer end (one end) of the spiral part 101. The lead electrode 102 is formed so as to reach one side of the second insulating layer 8 from the outer end (one end) of the spiral part 101. The inner end (other end) of the spiral part 101 is formed at a position corresponding to the contact hole 83 in the second insulating layer 8. Therefore, when the spiral part 101 is formed, the contact hole 83 is filled with a conductor, which comes into contact with the lead electrode 64 of the first conductor layer 6, so as to be electrically connected thereto.

On the inside of the spiral part 101, the connecting conductor 103 is formed from a position corresponding to the contact hole 81 in the second insulating layer 8 to a position corresponding to the contact hole 82. Therefore, when the connecting conductor 103 is formed, the contact holes 81 and 82 are filled with a conductor, whereby the inner end (other end) of the spiral part 61 of the first conductor layer 6 and the lead electrode 63 come into contact with the connecting conductor 103, so as to be electrically connected thereto.

The lead electrodes 104, 105, 106 are formed along the side of the second insulating layer 8 where the lead electrode 102 reaches. The lead electrodes 107, 108, 109, 110 are formed along one side of the second insulating layer 8 opposing the side thereof where the lead electrode 102 reaches.

The third insulating layer 12 is formed on the second conductor layer 10. The third insulating layer 12 is made of a resin material which is excellent in electric and magnetic insulating properties while having favorable workability, such as polyimide and epoxy resins. The third insulating layer 12 is formed by applying the above-mentioned resin material onto the second conductor layer 10 and then curing it. The resin material can be applied by a technique such as spin coating, dipping, or spraying.

The third conductor layer 14 is formed on the third insulating layer 12. The third conductor layer 14 has a spiral part 141 (third spiral part), a lead electrode 142 (third lead electrode), a lead electrode 143 (seventh lead electrode), a lead electrode 144 (eighth lead electrode), and lead electrodes 145, 146, 147, 148, 149. The third conductor layer 14 is produced by forming a thin conductor film on the third insulating layer 12 and then making a pattern of the spiral part 141 and lead electrodes 142, 143, 144, 145, 146, 147, 148, 149 by photolithography.

The spiral part 141 is formed so as to draw a rectangular convolution in a plane along which the third insulating layer 12 extends. The lead electrode 142 extends from the outer end (one end) of the spiral part 141. The lead electrode 142 is formed so as to reach one side of the second insulating layer 12 from the outer end (one end) of the spiral part 141.

The lead electrode 143 is formed so as to extend along the outer periphery of the spiral part 141 from one side of the third insulating layer 12 opposing the side thereof where the lead electrode 142 reaches. On the outside of the spiral part 141, one end of the lead electrode 143 is placed at a position corresponding to the inner end (other end) of the spiral part 141.

The lead electrode 144 is formed so as to extend along the outer periphery of the third insulating layer 12 from the side of the first insulating layer 12 opposing the side thereof where the lead electrode 142 reaches. One end of the lead electrode 144 is placed at a position corresponding to the inner end (other end) of a spiral part 181 which will be explained later. The lead electrodes 145, 146, 147 are formed at the side of the third insulating layer 12 where the lead electrode 142 reaches. The lead electrodes 148, 149 are formed at the side of the third insulating layer 12 opposing the side thereof where the lead electrode 142 reaches.

The fourth insulating layer 16 is formed on the third conductor layer 14. The fourth insulating layer 16 is made of a resin material which is excellent in electric and magnetic insulating properties while having favorable workability, such as polyimide and epoxy resins. The fourth insulating layer 16 is formed with contact holes 161, 162, 163.

The contact hole 161 is formed at a position where the inner end (other end) of the spiral part 141 can be seen therethrough. The contact hole 162 is formed at a position where one end of the lead electrode 143 can be seen therethrough. The contact hole 163 is formed at a position where one end of the lead electrode 144 can be seen therethrough.

The fourth insulating layer 16 is formed by applying the above-mentioned resin material onto the third conductor layer 14, exposing the applied resin material to light, and developing it, so as to cure it while in a state where the contact holes 161, 162, 163 are formed at predetermined positions. The resin material can be applied by a technique such as spin coating, dipping, or spraying.

The fourth conductor layer 18 is formed on the fourth insulating layer 16. The fourth conductor layer 18 has a spiral part 181 (fourth spiral part), a lead electrode 182 (sixth lead electrode), a connecting conductor 183, and lead electrodes 184, 185, 186, 187, 188, 189, 190. The fourth conductor layer 18 is produced by forming a thin conductor film on the fourth insulating layer 16 and then making a pattern of the spiral part 181, lead electrodes 182, 184, 185, 186, 187, 188, 189, 190, and connecting conductor 183 by photolithography.

The spiral part 181 is formed so as to draw a rectangular convolution in a plane along which the fourth insulating layer 16 extends. The lead electrode 182 extends from the outer end (one end) of the spiral part 181. The lead electrode 182 is formed so as to reach one side of the fourth insulating layer 16 from the outer end (one end) of the spiral part 181. The inner end (other end) of the spiral part 181 is formed at a position corresponding to the contact hole 163 in the fourth insulating layer 16. Therefore, when the spiral part 181 is formed, the contact hole 163 is filled with a conductor, which comes into contact with the lead electrode 144 of the third conductor layer 14, so as to be electrically connected thereto.

On the inside of the spiral part 181, the connecting conductor 183 is formed from a position corresponding to the contact hole 161 in the fourth insulating layer 16 to a position corresponding to the contact hole 162. Therefore, when the connecting conductor 183 is formed, the contact holes 161 and 162 are filled with a conductor, whereby the inner end (other end) of the spiral part 141 of the third conductor layer 14 and the lead electrode 143 come into contact with the connecting conductor 183, so as to be electrically connected thereto.

The lead electrodes 184, 185, 186 are formed along the side of the fourth insulating layer 16 where the lead electrode 182 reaches. The lead electrodes 187, 188, 189, 190 are formed along one side of the fourth insulating layer 16 opposing the side thereof where the lead electrode 182 reaches.

The fifth insulating layer 20 is formed on the fourth conductor layer 18. The fifth insulating layer 20 is made of a resin material which is excellent in electric and magnetic insulating properties while having favorable workability, such as polyimide and epoxy resins. The fifth insulating layer 20 is formed by applying the above-mentioned resin material onto the fourth conductor layer 18 and then curing it. The resin material can be applied by a technique such as spin coating, dipping, or spraying.

The second magnetic substrate MB4 is bonded onto the fifth insulating layer 20 through an adhesive layer (not depicted).

Figure 6:
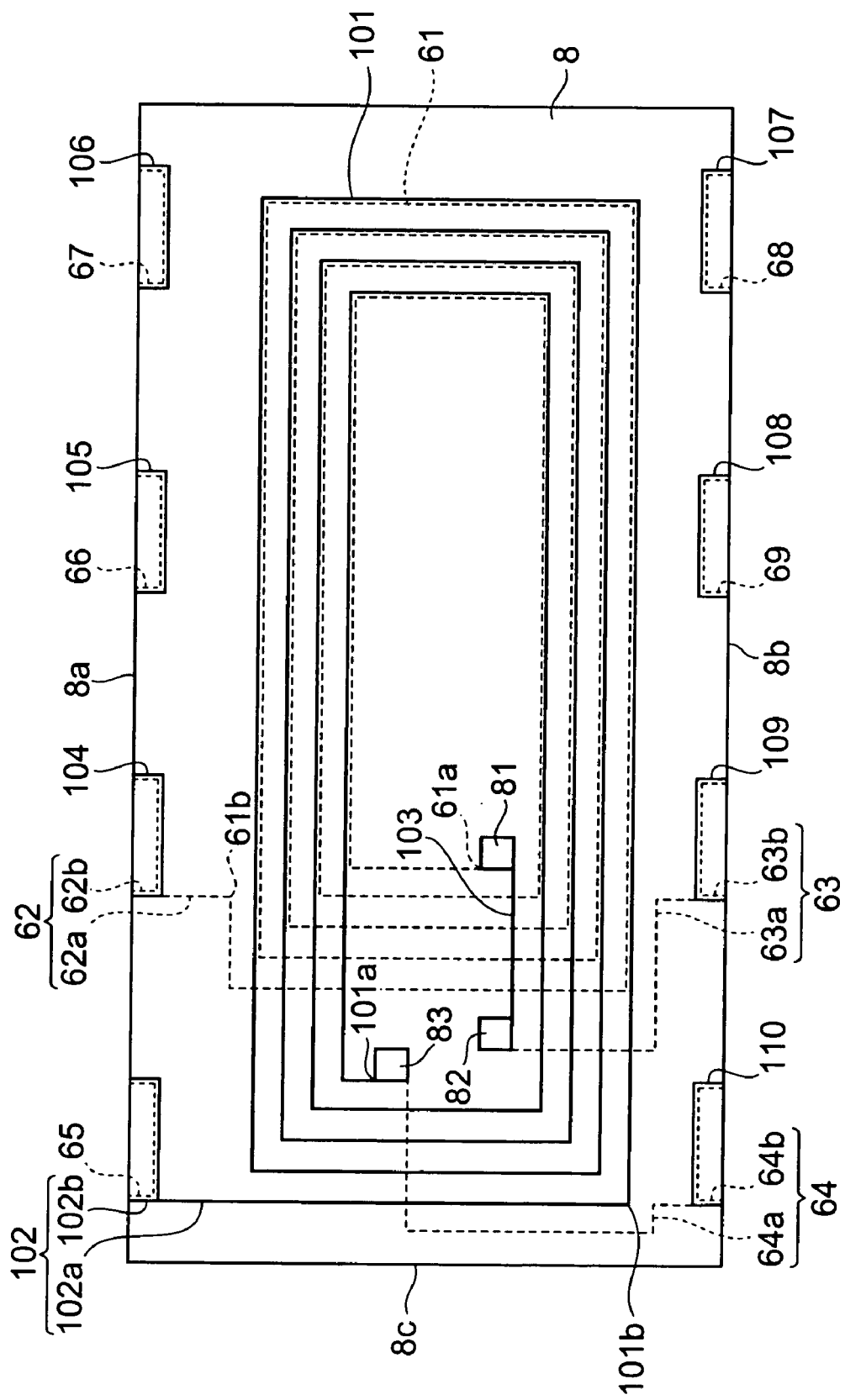
FIG. 6 is a plan view of the layer structure shown in FIG. 4.

The first conductor layer 6 and second conductor layer 10 will now be explained with reference to FIG. 6. FIG. 6 is a plan view of the layer structure LS2, illustrating a state removing the layers ranging from the third insulating layer 12 to the fifth insulating layer 20. In FIG. 6, solid and broken lines indicate the second conductor layer 10 and first conductor layer 6, respectively, whereas the portion drawn by a double line composed of solid and broken lines shows a portion where patterns of the first conductor layer 6 and second conductor layer 10 overlap each other.

The spiral part 61 of the first conductor layer 6 employs an end portion 61a formed at a position in contact with the contact hole 81 as the inner end (other end), and is formed so as to draw a rectangular convolution outward therefrom to an end portion 61b acting as the outer end (one end).

The lead electrode 62 is constructed by a linear portion 62a and a planar portion 62b. The linear portion 62a is connected to the end portion 61b that is the outer end (one end) of the spiral part 61. The planar portion 62b is connected to the linear portion 62a.

The linear portion 62a extends from the end portion 61b of the spiral part 61 toward a side 8a of the second insulating layer 8, so as to reach the planar portion 62b.

The lead electrode 63 is positioned so as to oppose the lead electrode 62. The lead electrode 63 is constructed by a planar portion 63b and a linear portion 63a. The planar portion 63b is formed along a side 8b of the second insulating layer 8. The linear portion 63a extends so as to connect the planar portion 63b and the contact hole 82 to each other.

The linear portion 63a extends from the planar portion 63b toward the spiral part 61, and then circumvents the spiral part 61, so as to reach the contact hole 82.

The contact holes 81 and 82 are connected to both ends of the connecting conductor 103, respectively. The connecting conductor 103 is formed so as to bridge the inside and outside of the spiral part 61. Since the contact hole 82 is formed at a position separated from the outermost peripheral portion of the spiral part 61, stray capacitance can be prevented from occurring between the lead electrodes 62 and 63 (the input and output portions of the spiral part 61).

The spiral part 101 of the second conductor layer 10 employs an end portion 101a formed at a position in contact with the contact hole 83 as the inner end (other end), and is formed so as to draw a rectangular convolution outward therefrom to an end portion 101b acting as the outer end (one end).

The lead electrode 102 is constructed by a linear portion 102a and a planar portion 102b. The linear portion 102a is connected to the end portion 101b that is the outer end (one end) of the spiral part 101. The planar portion 102b is connected to the linear portion 102a.

The linear portion 102a extends along a side 8c of the second insulating layer 8 from the end portion 101b of the spiral part 101 toward the side 8a of the second insulating layer 8, so as to reach the planar portion 102b.

The lead electrode 64 is positioned so as to oppose the lead electrode 102 (lead electrode 65). The lead electrode 64 is constructed by a planar portion 64b and a linear portion 64a. The planar portion 64b is formed along the side 8b of the second insulating layer 8. The linear portion 64a extends so as to connect the planar portion 64b and the contact hole 83 to each other.

The linear portion 64a extends from the planar portion 64b toward the spiral part 101, and then along the side 8c of the second insulating layer 8 such as to circumvent the spiral part 101. The linear portion 64a is bent at substantially the middle position of the side 8c, so as to reach the contact hole 83.

The contact hole 83 is connected to the inner end (other end) of the spiral part 101 and the linear portion 64a.

Therefore, the spiral part 101 and lead electrode 64 are in contact with each other so as to be electrically connected together.

Since the linear portion 64a of the lead electrode 64 is formed at a position separated from the outermost peripheral portion of the spiral part 101, stray capacitance can be prevented from occurring between the lead electrodes 102 and 64 (the input and output portions of the spiral part 101).

Figure 7:
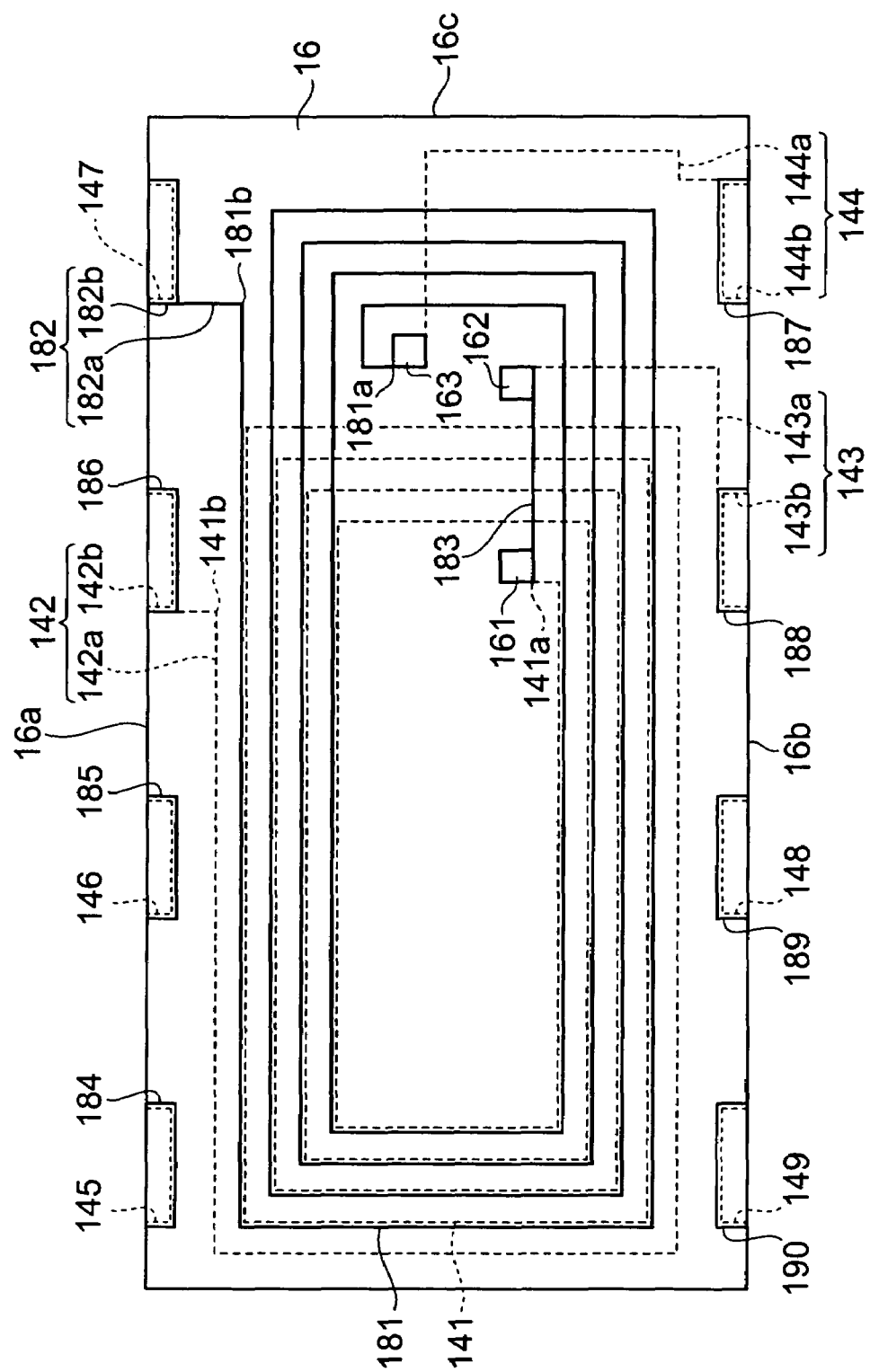
FIG. 7 is a plan view of the layer structure shown in FIG. 4.

The third conductor layer 14 and fourth conductor layer 18 will now be explained with reference to FIG. 7. FIG. 7 is a plan view of the layer structure LS2, illustrating a state removing the fifth insulating layer 20. In FIG. 7, solid and broken lines indicate the fourth conductor layer 18 and third conductor layer 14, respectively, whereas the portion drawn by a double line composed of solid and broken lines shows a portion where patterns of the third conductor layer 14 and fourth conductor layer 18 overlap each other.

The spiral part 141 of the third conductor layer 14 employs an end portion 141a formed at a position in contact with the contact hole 161 as the inner end (other end), and is formed so as to draw a rectangular convolution outward therefrom to an end portion 141b acting as the outer end (one end).

The lead electrode 142 is constructed by a linear portion 142a and a planar portion 142b. The linear portion 142a is connected to the end portion 141b that is the outer end (one end) of the spiral part 141. The planar portion 142b is connected to the linear portion 142a.

The linear portion 142a extends from the end portion 141b of the spiral part 141 toward a side 16a of the fourth insulating layer 16, so as to reach the planar portion 142b.

The lead electrode 143 is positioned so as to oppose the lead electrode 142. The lead electrode 143 is constructed by a planar portion 143b and a linear portion 143a. The planar portion 143b is formed along a side 16b of the fourth insulating layer 16. The linear portion 143a extends so as to connect the planar portion 143b and the contact hole 162 to each other.

The linear portion 143a extends from the planar portion 143b toward the spiral part 141, and then circumvents the spiral part 141, so as to reach the contact hole 162.

The contact holes 161 and 162 are connected to both ends of the connecting conductor 183, respectively. The connecting conductor 183 is formed so as to bridge the inside and outside of the spiral part 141. Since the contact hole 162 is formed at a position separated from the outermost peripheral portion of the spiral part 141, stray capacitance can be prevented from occurring between the lead electrodes 142 and 143 (the input and output portions of the spiral part 141).

The spiral part 181 of the fourth conductor layer 18 employs an end portion 181a formed at a position in contact with the contact hole 163 as the inner end (other end), and is formed so as to draw a rectangular convolution outward therefrom to an end portion 181b acting as the outer end (one end).

The lead electrode 182 is constructed by a linear portion 182a and a planar portion 182b. The linear portion 182a is connected to the end portion 181b that is the outer end (one end) of the spiral part 181. The planar portion 182b is connected to the linear portion 182a.

The linear portion 182a extends from the end portion 181b of the spiral part 181 toward the side 16a of the fourth insulating layer 16, so as to reach the planar portion 182b.

The lead electrode 144 is positioned so as to oppose the lead electrode 182 (lead electrode 147). The lead electrode 144 is constructed by a planar portion 144b and a linear portion 144a. The planar portion 144b is formed along the side 16*b* of the second insulating layer 16. The linear portion 144*a* extends so as to connect the planar portion 144*b* and the contact hole 163 to each other.

The linear portion 144*a* extends from the planar portion 144*b* toward the spiral part 181, and then along the side 16*c* of the fourth insulating layer 16 such as to circumvent the spiral part 181. The linear portion 144*a* is bent at substantially the middle position of the side 16*c*, so as to reach the contact hole 163.

The contact hole 163 is connected to the inner end (other end) of the spiral part 181 and the linear portion 144*a*. Therefore, the spiral part 181 and lead electrode 144 are in contact with each other so as to be electrically connected together.

Since the linear portion 144*a* of the lead electrode 144 is formed at a position separated from the outermost peripheral portion of the spiral part 181, stray capacitance can be prevented from occurring between the lead electrodes 182 and 144 (the input and output portions of the spiral part 181).

When two spiral parts 61 and 101 are formed so as to interpose the second insulating layer 8 therebetween as in this embodiment, interline electric strength can be secured more than in the case where two spiral parts are formed such that their respective wound portions are adjacent to each other. The same holds for the spiral parts 141, 181 and fourth insulating layer 16.

Since the two spiral parts 61 and 101 are arranged such as to have respective regions overlapping each other as seen in the laminating direction, this embodiment is excellent in the common-mode characteristic. The common-mode characteristic can further be improved when the two spiral parts 61 and 101 are arranged such as to overlap each other by one half or more as seen in the laminating direction. The same holds for the spiral parts 141, 181 and fourth insulating layer 16.

Though a so-called 4-line type common-mode filter is explained in this embodiment, each of pairs of lead electrodes 62 and 66, 63 and 69, 142 and 146, 143 and 148, 185 and 186, 188 and 189 located near the center may be connected to each other, so as to yield a 3-line type.

Third Embodiment

Figure 8:
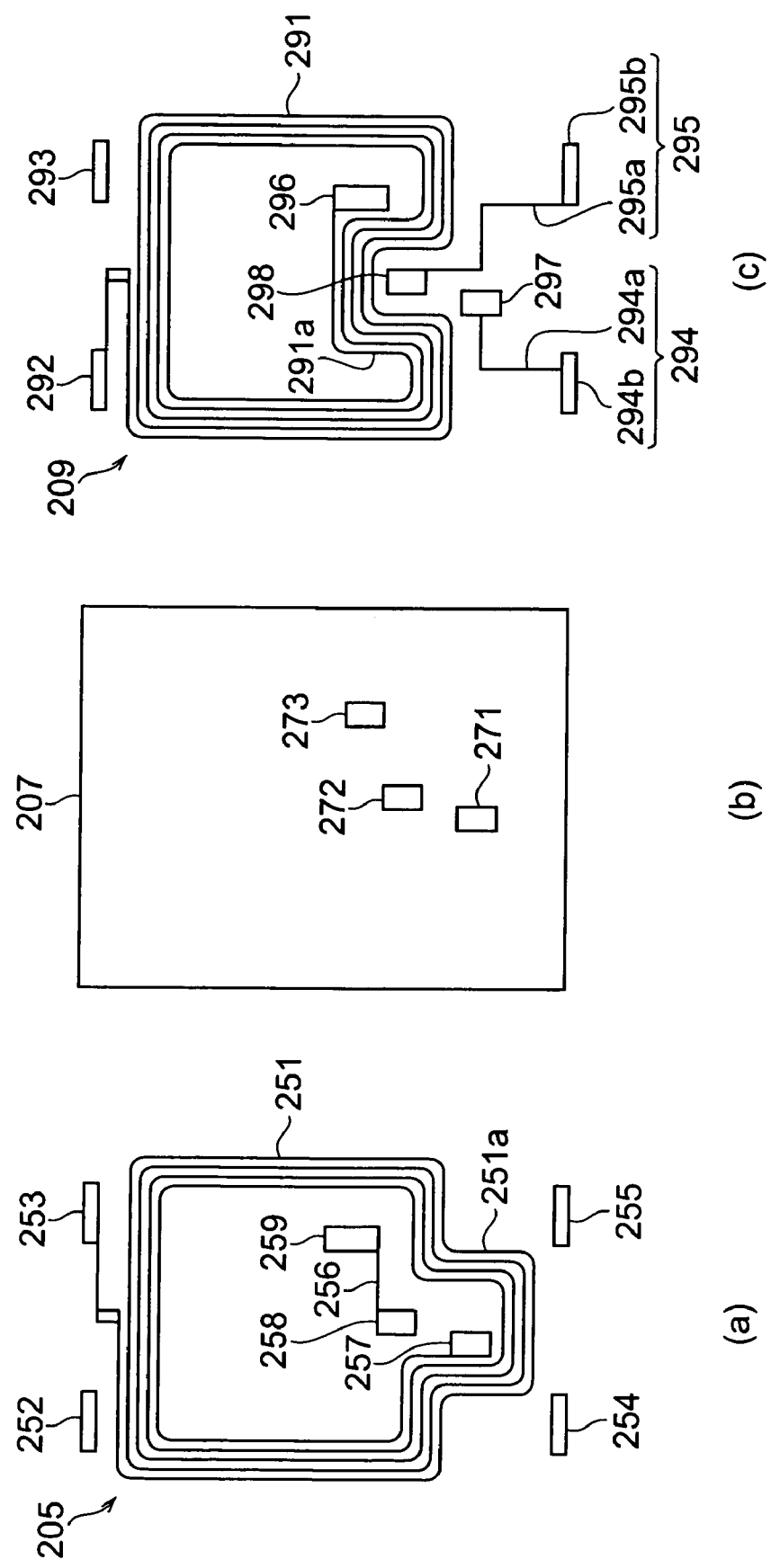
FIG. 8 is an exploded perspective view showing a part of a common-mode filter which is a third embodiment.

A common-mode filter which is a third embodiment of the present invention will be explained with reference to FIG. 8. The common-mode filter of this embodiment is provided with a first conductor layer 205, a second insulating layer 207, and a second conductor layer 209, which are shown in FIG. 8, in place of the first conductor layer 5, second insulating layer 7, and second conductor layer 9 in the common-mode filter CF of the first embodiment.

The first conductor layer 205 is formed on the first insulating layer 3 (see FIG. 2). As shown in (a) in FIG. 8, the first conductor layer 205 has a spiral part (second spiral part) 251, a lead electrode 252, a lead electrode 253 (second lead electrode), a lead electrode 254, a lead electrode 255, and a connecting conductor 256. The lead electrodes 252, 253 are arranged on one side of the first insulating layer 3, whereas the lead electrodes 254, 255 are arranged on one side of the first insulating layer 3 opposing the side thereof where the lead electrodes 252, 253 reach.

The spiral part 251 is formed so as to draw a rectangular convolution in a plane along which the first insulating layer 3 extends. The spiral part 251 has a bent portion 251*a* (second bent portion) bent substantially rectangularly toward the lead electrodes 254, 255. The lead electrode 253 extends from the outer end (one end) of the spiral part 251.

The inner end (other end) of the spiral part 251 extends to the region of the bent portion 251*a*, so as to connect with a connecting portion 257.

The connecting conductor 256 is formed at a position near the bent portion 251*a* in the area on the inside of the spiral part 251. Connecting portions 258, 259 are connected to both ends of the connecting conductor 256, respectively.

The second insulating layer 207 is formed on the first conductor layer 205. As shown in (b) in FIG. 8, the second insulating layer 207 is formed with contact holes 271, 272, 273. The contact hole 271 is formed at a position where the connecting portion 257 can be seen therethrough. The contact hole 272 is formed at a position where the connecting portion 258 can be seen therethrough. The contact hole 273 is formed at a position where the connecting portion 259 can be seen therethrough.

The second conductor layer 209 is formed on the second insulating layer 207. As shown in (c) in FIG. 8, the second conductor layer 209 has a spiral part (first spiral part) 291, a lead electrode 292 (first lead electrode), a lead electrode 293, a lead electrode 294 (fourth lead electrode), and a lead electrode 295 (third lead electrode). The lead electrodes 292, 293 are arranged on one side of the second insulating layer 207 (the side corresponding to the lead electrodes 252, 253). The lead electrodes 294, 295 are arranged on one side (the side corresponding to the lead electrodes 254, 255) opposing the side thereof where the lead electrodes 292, 293 reach.

The spiral part 291 is formed so as to draw a rectangular convolution in a plane along which the second insulating layer 207 extends. The spiral part 291 has a bent portion 291*a* (first bent portion) bent substantially rectangularly toward the center of the spiral part 291 at a position corresponding to the bent portion 251*a* of the spiral part 251. The lead electrode 292 extends from the outer end (one end) of the spiral part 291. The inner end (other end) of the spiral part 291 extends to the region of the bent portion 291*a*, so as to connect with a connecting portion 296 formed at a position corresponding to the contact hole 273.

The lead electrode 294 is constructed by a planar portion 294*b* and a linear portion 294*a*. The planar portion 294*b* is formed along one side of the second insulating layer 207. The linear portion 294*a* extends so as to connect the planar portion 294*b* to a connecting portion 297 formed at a position corresponding to the contact hole 271.

The lead electrode 295 is constructed by a planar portion 295*b* and a linear portion 295*a*. The planar portion 295*b* is formed along the side of the second insulating layer 207. The linear portion 295*a* extends so as to connect the planar portion 295*b* to a connecting portion 298 formed at a position corresponding to the contact hole 272.

Figure 9:
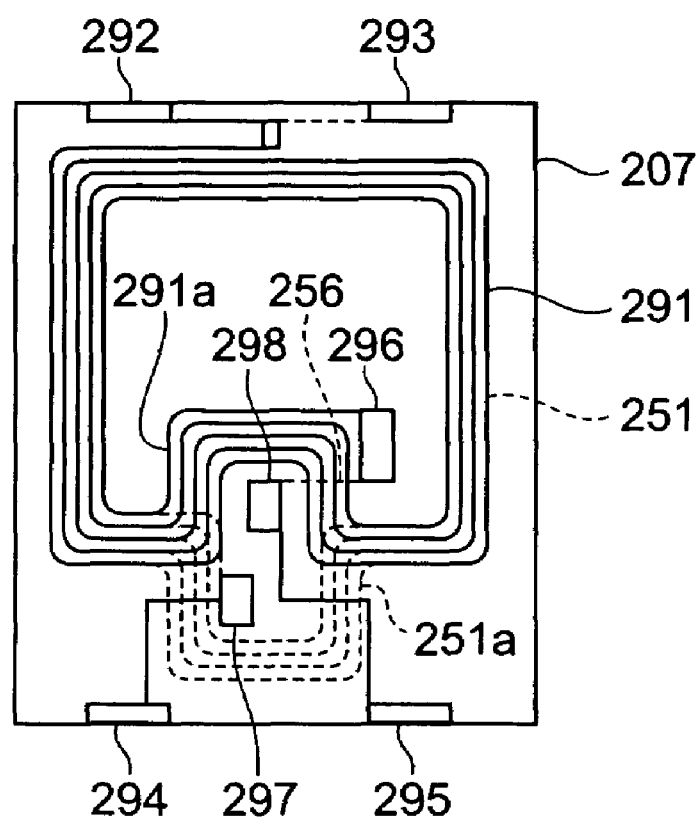
FIG. 9 is a plan view of the layer structure shown in FIG. 8.

The first conductor layer 205 and second conductor layer 209 will now be explained with reference to FIG. 9. FIG. 9 is a plan view of the layer structure LS in this embodiment, illustrating a state removing the third insulating layer 11 (see FIG. 2).

The region other than the bent portion 251*a* in the spiral part 251 of the first conductor layer 205 and the region other than the bent portion 291*a* in the spiral part 291 of the second conductor layer 209 overlap each other as seen in the laminating direction of the layer structure LS. Namely, a coil conductor pattern is formed such as to minimize the area where the spiral parts 251, 291 do not overlap. This enhances the magnetic coupling in the common-mode filter, thereby lowering the impedance in a differential mode (normal mode) in which signals are transmitted. As a result, the loss in signal transmission can be reduced, whereby signals can be transmitted favorably.

When seen in the laminating direction, the bent portions 251a, 291a form a substantially quadrangular portion, whereas the contact holes 271, 272 for connecting the first conductor layer 205 and second conductor layer 209 to each other are arranged in the area corresponding to the inner region of the substantially quadrangular portion. The connecting conductor 256 is formed so as to bridge across the bent portion 291a. Therefore, the lead electrodes 252 to 255, connecting conductor 256, and lead electrodes 292 to 295 can be formed with a favorable space efficiency by utilizing the bent portions 251a, 291a.

The spiral parts 251, 291 are formed such that the two coils have conductor lengths equal to each other. In this case, the spiral parts 251, 291 are equal in inductance and resistance. The line length difference between lines of the coils becomes smaller. This reduces the impedance difference between the lines, thereby sufficiently restraining it from adversely affecting signals detected at a receiving end of the common-mode filter.

As in the foregoing, this embodiment can secure the interline electric strength of the spiral parts while being able to prevent stray capacitance from occurring between the input and output portions of the spiral parts as with the first and second embodiments.

Also, this embodiment can reduce the impedance difference between the two coils while being able to secure excellent magnetic coupling, thereby making it possible to further improve the common-mode characteristic of the common-mode filter.

This embodiment modifies the common-mode filter CF of the first embodiment, but can also be employed in so-called 4-line types such as that of the second embodiment.

Though each of the above-mentioned embodiments is explained as one in which one conductor layer is provided with one spiral part, the common-mode filter may be of a so-called array type in which one conductor layer has a plurality of spiral parts.

In the case of the common-mode filter explained with reference to FIGS. 1 to 3, for example, a plurality of sets of spiral parts 51, lead electrodes 52, lead electrodes 53, lead electrodes 54, and lead electrodes 55 are provided in the first conductor layer 5 with each set keeping its positional relationship as it is. In conformity to the plurality of sets provided in the first conductor layer 5, a plurality of sets of spiral parts 91, connecting conductors 93, lead electrodes 92, lead electrodes 94, lead electrodes 95, and lead electrodes 96 are provided in the second conductor layer 9 while keeping its positional relationship as it is. The same holds for the common-mode filter CF2 explained with reference to FIGS. 4 to 7.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A common-mode filter comprising:
   a first conductor layer having a first spiral part formed so as to draw a convolution and a first lead electrode extending from one end of the first spiral part;
   a second conductor layer having a second spiral part formed so as to draw a convolution and a second lead electrode extending from one end of the second spiral part; and
   an insulating layer placed between the first and second conductor layers;
   wherein the first conductor layer is formed with third and fourth lead electrodes;
   wherein the second conductor layer is formed with a connecting conductor connecting the third lead electrode to the other end of the first spiral part;
   wherein the fourth lead electrode is connected to the other end of the second spiral part through a contact hole formed in the insulating layer;
   wherein the third lead electrode is connected to one end of the connecting conductor through a contact hole formed in the insulating layer; and
   wherein the other end of the connecting conductor is connected to the other end of the first spiral part through a contact hole formed in the insulating layer.

2. A common-mode filter according to claim 1, wherein the first and second conductor layers have respective regions overlapping each other.

3. A common-mode filter according to claim 2, wherein the first spiral part has a first bent portion bent toward a center of the first spiral part;
   wherein the second spiral part has a second bent portion bent toward a side opposite from a center of the second spiral part at a position corresponding to the first bent portion; and
   wherein a region other than the first bent portion in the first spiral part and a region other than the second bent portion in the second spiral part overlap each other.

4. A common-mode filter according to claim 3, wherein a conductor forming the first spiral part and a conductor forming the second spiral part have substantially the same length.

5. A common-mode filter according to claim 1, wherein the first and second conductor layers are formed with a plurality of first spiral parts, first lead electrodes, second spiral parts, second lead electrodes, third lead electrodes, fourth lead electrodes, and connecting conductors corresponding thereto.

6. A common-mode filter according to claim 1, further comprising:
   a third conductor layer having a third spiral part formed so as to draw a convolution and a fifth lead electrode extending from one end of the third spiral part;
   a fourth conductor layer having a fourth spiral part formed so as to draw a convolution and a sixth lead electrode extending from one end of the fourth spiral part;
   an insulating layer placed between the second and third conductor layers; and
   an insulating layer placed between the third and fourth conductor layers;
   wherein the fourth conductor layer is formed with seventh and eighth lead electrodes;
   wherein the fourth conductor layer is formed with a second connecting conductor connecting the seventh lead electrode to the other end of the third spiral part;
   wherein the eighth lead electrode is connected to the other end of the fourth spiral part through a contact hole formed in the insulating layer placed between the third and fourth conductor layers;
   wherein the seventh lead electrode is connected to one end of the second connecting conductor through a contact hole formed in the insulating layer placed between the third and fourth conductor layers; and
   wherein the other end of the second connecting conductor is connected to the other end of the third spiral part through a contact hole formed in the insulating layer placed between the third and fourth conductor layers.

* * * * *